(12) United States Patent
Lin et al.

(10) Patent No.: US 7,894,274 B2
(45) Date of Patent: Feb. 22, 2011

(54) MEMORIES WITH IMPROVED WRITE CURRENT

(75) Inventors: Chih Sheng Lin, Tainan County (TW);
Min-Chuan Wang, Taichung (TW);
Chih-Wen Hsiao, Hsinchu County (TW); Keng-Li Su, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 76 days.

(21) Appl. No.: 12/479,612

(22) Filed: Jun. 5, 2009

(65) Prior Publication Data
US 2010/0118617 A1 May 13, 2010

(30) Foreign Application Priority Data
Nov. 12, 2008 (TW) .............................. 97143651 A (51) Int. Cl.
*G11C 7/00* (2006.01)
(52) U.S. Cl. .............................. 365/189.03; 365/189.18; 365/189.13; 365/226
(58) Field of Classification Search ............ 365/189.03, 365/185.18, 185.13, 226
See application file for complete search history.

(56) References Cited

U.S. PATENT DOCUMENTS

| 5,327,026 A | 7/1994 | Hardee et al. |
|---|---|---|
| 5,544,102 A | 8/1996 | Tobita et al. |
| 5,708,387 A | 1/1998 | Cleveland et al. |
| 5,914,867 A * | 6/1999 | Pascucci ..................... 363/60 |
| 6,201,412 B1 | 3/2001 | Iwata et al. |
| 6,407,600 B1 * | 6/2002 | Lu et al. ..................... 327/156 |
| 7,102,425 B2 * | 9/2006 | Lee, II ........................ 327/589 |
| 7,558,116 B2 * | 7/2009 | Ch'ng et al. ........... 365/185.18 |

OTHER PUBLICATIONS

Dietmar Gogl et al. "A 16-Mb MRAM Featuring Bootstrapped Write Drivers," IEEE Journal of Solid-State Circuits, Apr. 2005, vol. 40, No. 4, pp. 902-908, US.

Taiwan Patent Office, Office Action, Patent Application Serial No. 097143651, Dec. 13, 2010, Taiwan.

\* cited by examiner

*Primary Examiner*—Connie C Yoha (57) ABSTRACT

A memory with improved write current is provided, including a bit line, a write switch and a control circuit. The write switch is coupled between a voltage source and the bit line, and has a control terminal. Based on a bit line select signal, the control circuit controls the electric conductance of the write switch and discharges/charges the parasitic capacitors of the write switch. The voltage source is turned on after the control terminal of the write switch reaches a pre-determined voltage level.

13 Claims, 8 Drawing Sheets

MEMORIES WITH IMPROVED WRITE CURRENT

CROSS REFERENCE TO RELATED APPLICATIONS

The present application is based on, and claims priority from, Taiwanese Application Serial No. 097143651 filed Nov. 12, 2008, the disclosure of which is hereby incorporated by reference herein in its entirety.

BACKGROUND OF THE INVENTION

1. Field of the Invention

The disclosure relates to memories. More particularly, and the disclosure relates to memories and write current improving techniques thereof.

2. Description of the Related Art

Figure 1:
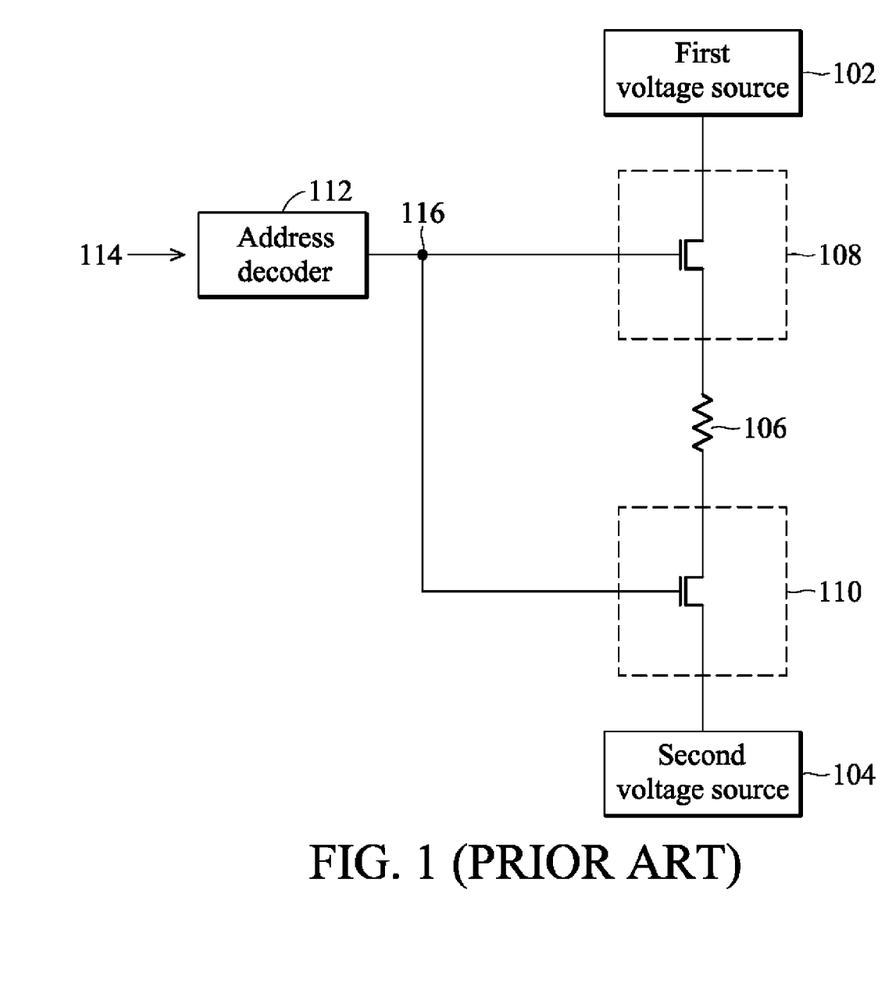
FIG. 1 depicts the structure of a conventional MRAM.

Today, there are several current-controlled memories. The physical properties of a memory cell can be controlled by the write current flowing therethrough. The data stored in the memory cell is dependent on the physical properties thereof. Magnetoresistive Random Access Memory (MRAM) and Phase Change Memory (PCM) are current-controlled memories. FIG. 1 depicts the essential structure of a conventional MRAM. As shown, a first voltage source 102, a second voltage source 104, a bit line (depicted by its equivalent resistor 106), write switches 108 and 110, and an address decoder 112 are included. The circuit represents one memory cell. The data stored in the memory cell is dependent on the magnetization of the memory cell, and the magnetization of the memory cell is dependent on a write current direction on the bit line (resistor 106). Logic '0' may be represented by one magnetization direction, while logic '1' may be represented by the other magnetization direction.

This paragraph discusses the operations of the circuit of FIG. 1. An address signal 114 is sent to the address decoder 112 to be decoded to a bit line select signal 116. When the bit line select signal 116 is enabled, the write switches 108 and 110 are turned on to allow current to flow through the bit line (resistor 106). The first and second voltage sources 102 and 104 are designed to provide voltages in a write period after the enabling of the bit line select signal 116. In the write period, a write current, from the first voltage source 102 to the second voltage source 104 or from the second voltage source 104 to the first voltage source 102, is provided on the bit line (resistor 106). The two different current directions allow the memory cell to store two different logic levels.

The direction of the write current is dependent on the voltage levels provided by the voltage sources 102 and 104. When the first voltage source 102 provides a high voltage level and the second voltage source 104 provides a low voltage level (such as a ground), the write current flows from the first voltage source 102 to the second voltage source 104. On the contrary, when the first voltage source 102 is the ground and the second voltage source 104 provides the high voltage level, the write current flows from the second voltage source 104 to the first voltage source 102.

An MRAM is a non-volatile memory and has high memory cell density, fast read/write speeds and high radiation resistance. However, one drawback of MRAMs is that high write currents are required. In conventional techniques, the write switches 108 and 110 are realized by MOSFETs. The maximum current provided by an MOSFET is limited to the saturation current thereof. To provide enough write current, conventional techniques usually increase the size of the MOSFETs or minimize the resistance of the bit line (resistor 106).

The conventional techniques result in large-sized memories and complex memory structures, thus increasing the costs for the memory.

BRIEF SUMMARY OF THE INVENTION

The invention discloses memories with improved write current. An exemplary embodiment of the memories of the invention comprises a bit line, a write switch and a control circuit. The write switch is coupled between a voltage source and the bit line, and has a control terminal. According to a bit line select signal from an address decoder, the control circuit controls the electric conduction of the write switch as well as discharges/charges the parasitic capacitors of the write switch. When the bit line select signal is disabled, the control circuit discharges the parasitic capacitors of the write switch. When the bit line select signal is enabled, the control circuit charges the parasitic capacitor until the control terminal of the write switch reaches a predetermined voltage level. After the voltage level of the control terminal reaches the pre-determined voltage level, the voltage source is turned on to push/sink a write current to/from the bit line.

Because of the parasitic capacitor of the write switch, the control terminal of the write switch responds to the voltage pumping from the voltage source. In a case wherein the voltage source outputs a positive voltage, the voltage level of the control terminal of the write switch is pushed to a voltage level much greater than the pre-determined voltage level. Compared with conventional techniques, the invention generates an improved write current.

Another embodiment of the memories of the invention comprises a bit line, a write switch, a capacitor and a control circuit. The write switch is coupled between a voltage source and the bit line, and has a control terminal. The capacitor is coupled between a pulse voltage source and the control terminal of the write switch. According to a bit line select signal from an address decoder, the control circuit controls the electric conduction of the write switch as well as discharges/charges the capacitor. When the bit line select signal is disabled, the control circuit discharges the capacitor. When the bit line select signal is enabled, the control circuit charges the capacitor until the control terminal of the write switch reaches a predetermined voltage level. After the charging of the capacitor, the pulse voltage source is turned on to output a pulse voltage. Because of the capacitor, the control terminal of the write switch responds to the voltage pumping of the pulse voltage. The voltage level of the control terminal of the write switch is pushed to a voltage level much greater than the pre-determined voltage level. Thus, an improved write current is allowed in the bit line.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description embodiments carrying out the invention. This description is made for the purpose of illustrating the general principles of the invention and should not be taken in a limiting sense. The scope of the invention is best determined by reference to the appended claims.

Figure 2A:
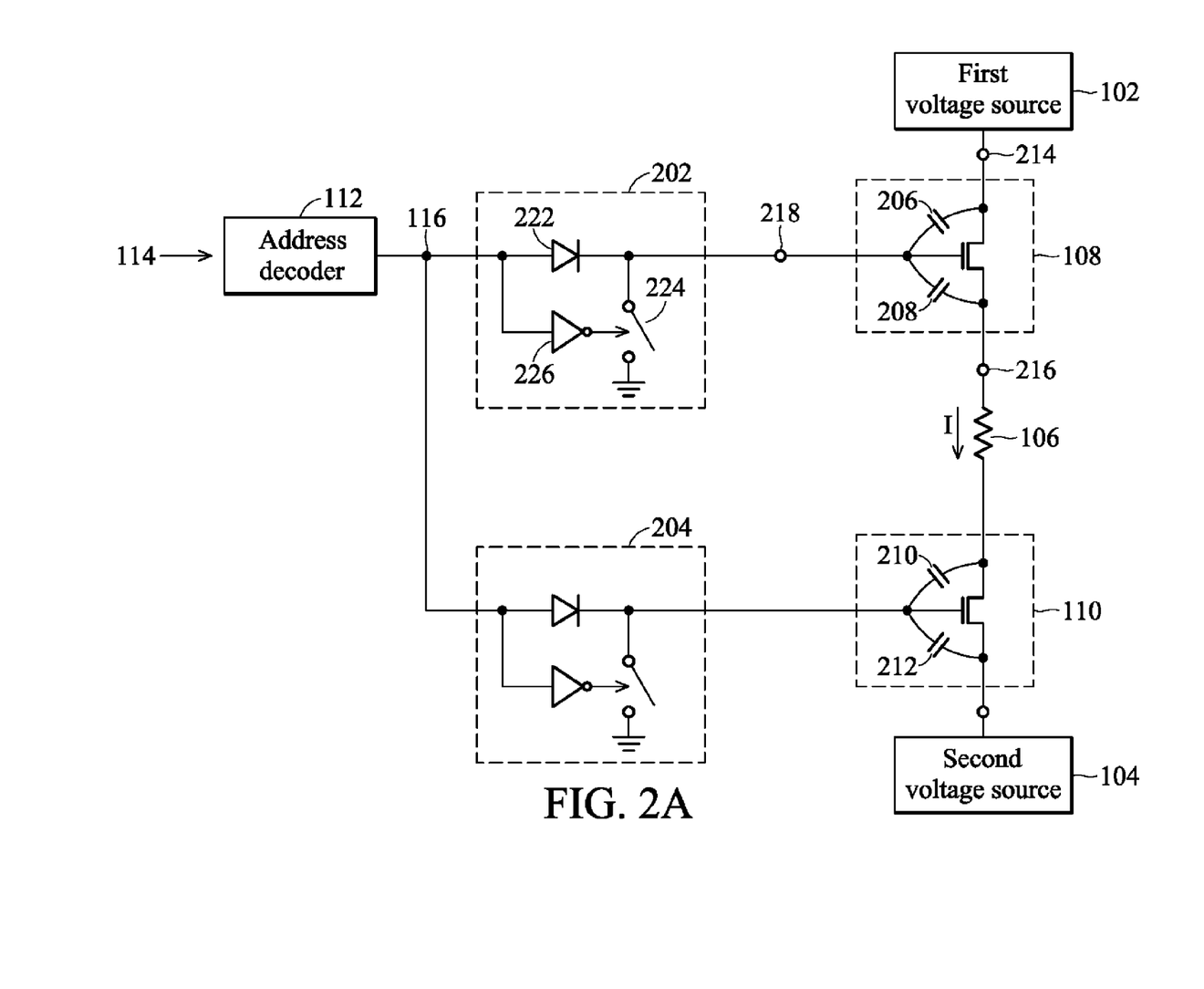
FIG. 2A depicts an embodiment of the memories of the invention.

FIG. 2A depicts an embodiment of the memories of the invention. Compared with the conventional memory cell shown in FIG. 1, the memory cell of FIG. 2A further comprises control circuits 202 and 204. The control circuit 202 is coupled between the address decoder 112 and the write switch 108. The control circuit 204 is coupled between the address decoder 112 and the write switch 110. In the embodiment shown in FIG. 2A, the write switches 108 and 110 are realized by MOSFETs. FIG. 2A further depicts parasitic capacitors 206 and 208 of the write switch 108 and parasitic capacitors 210 and 212 of the write switch 110.

The following paragraphs discuss the operations of the memory cell of FIG. 2A. The write switch 108 has a first terminal 214 coupled to a first voltage source 102, a second terminal 216 coupled to a bit line (equivalent by a resistor 106), and a control terminal 218 coupled to the control circuit 202. The electric conductance of the write switch 108 is dependent on the voltage level of the control terminal 218. The address decoder 112 decodes an address signal 114 to output a bit line select signal 116. Before the bit line select signal 116 is enabled, the control circuit 202 keeps the write switch 108 off and discharges the parasitic capacitors 206 and 208. When the bit line select signal 116 is enabled, the control circuit 202 turns on the write switch 108 and charges the parasitic capacitors 206 and 208. After the charging process, the control terminal 218 reaches a pre-determined voltage level. After the control terminal 218 reaches the predetermined voltage level, the memory cell may enter a write period. The first voltage source 102 may be powered on to output a high voltage level to generate a write current flowing from the first voltage source 102 to the second voltage source 104 (as shown by symbol I). The control terminal 218 responds to the voltage pumping of the first voltage source 102 because of the parasitic capacitor 206. The voltage level of the control terminal 218 is pumped to be greater than the predetermined voltage level. Compared with conventional techniques, the write switch 108 allows a greater write current to flow through the bit line (resistor 106).

The control circuit 204 works similarly to the control circuit 202. The control circuit 204 controls the electric conduction of the write switch 110 and discharges/charges the parasitic capacitors 210 and 212. Before the bit line select signal 116 is enabled, the control circuit 204 discharges the parasitic capacitors 210 and 212. When the bit line select signal 116 is enabled, the control circuit 204 charges the parasitic capacitors 210 and 212 until the control terminal of the write switch 110 reaches a pre-determined voltage level. In a case wherein the write current is from the first voltage source 102 to the second voltage source 104, the voltage pumping of the first voltage source 102 is provided on the control terminal of the write switch 110 because of the parasitic capacitor 210. The control terminal of the write switch 110 is pumped to a voltage level greater than the pre-determined voltage level. Compared with conventional techniques, the write switch 110 allows a greater write current to flow through the bit line (resistor 106).

In another case wherein the first voltage source 102 is ground and the second voltage source 104 provides a positive voltage level in the write period, a write current from the second voltage source 104 to the first voltage source 102 is generated. Because of the parasitic capacitors 208 and 212, the control terminals of the write switches 108 and 110 respond to the voltage pumping of the second voltage source 104, and are pumped to greater voltage levels. Thus, the write switches 108 and 110 allow a greater write current to flow through the bit line (resistor 106).

FIG. 2A further details an embodiment of the control circuits. As shown, control circuit 202 comprises a diode 222, a switching element 224 and an inverter 226. The diode 222 has an input terminal coupled to the address decoder 112 to receive the bit line select signal 116, and has an output terminal coupled to the control terminal 218 of the write switch 108. The input terminal of the inverter 226 receives the bit line select signal 116. The switching element 224 is controlled by the output signal of the inverter 226. When the bit line select signal 116 is disabled, the switching element 224 is turned on and the control terminal 218 is coupled to the ground. On the contrary, when the bit line select signal 116 is enabled, the switching element 224 is turned off and the control terminal 218 is connected to the diode 222 instead.

Figure 2B:
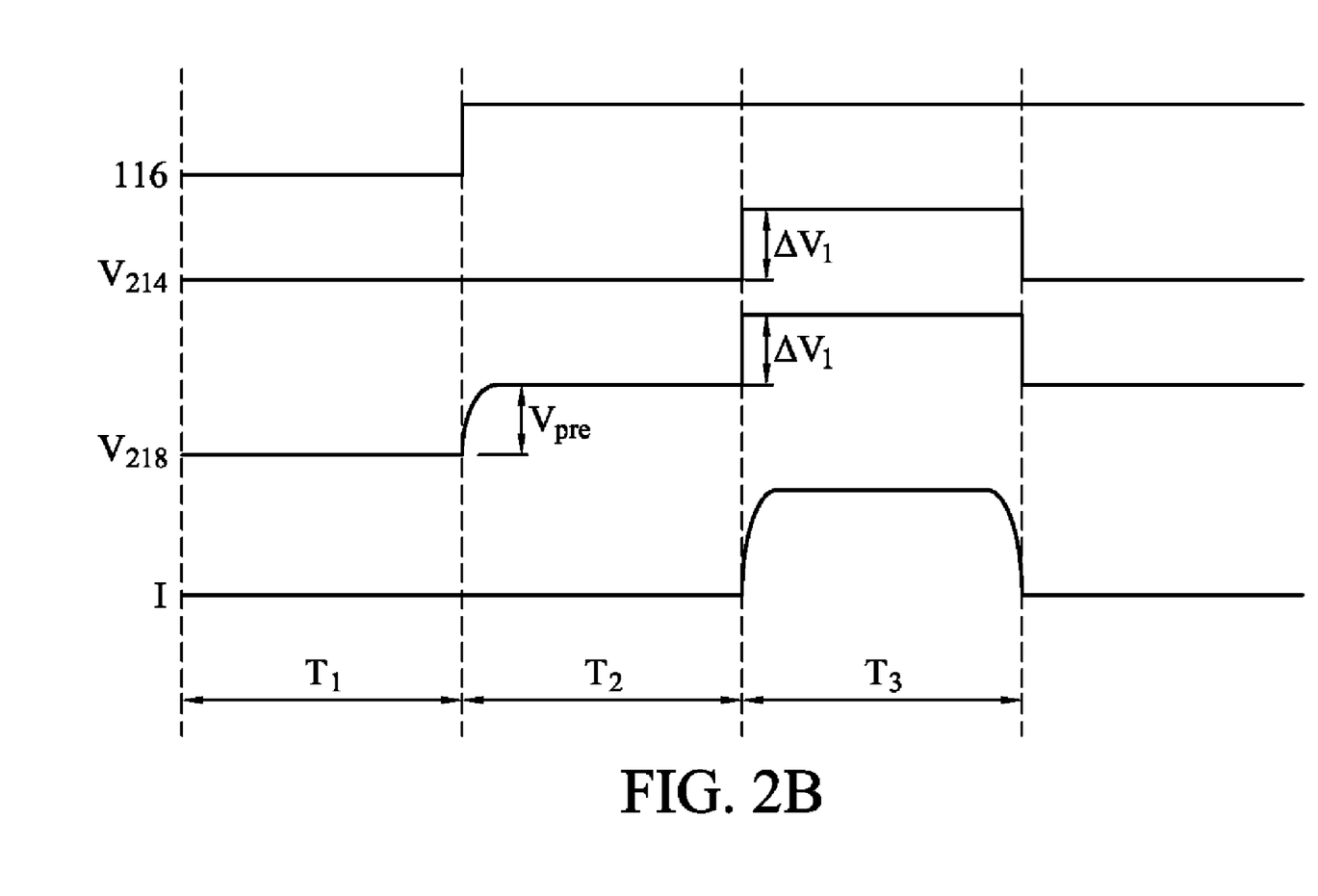
FIG. 2B shows waveforms of signals of FIG. 2A.

FIG. 2B shows waveforms of signals of FIG. 2A. As shown, FIG. 2B includes the bit line select signal 116, voltage waveforms $V_{214}$ and $V_{218}$ of terminals 214 and 218 of FIG. 2A, and a current waveform I of the write current. There are three time periods, $T_1$, $T_2$ and $T_3$, representing the discharging period, the charging period and the voltage pumping period, respectively. Before the bit line select signal 116 is enabled (during the discharging period $T_1$), the output of the inverter 226 is in a high voltage level. The switching element 224 is in an enable state to ground the control terminal 218. The parasitic capacitors 206 and 208 are discharged through the enabled switching element 224. When the bit line select signal 116 is enabled, and the memory cell enters the charging period $T_2$. The diode 222 is turned on and the inverter 226 outputs a low voltage level signal to turn off the switching element 224. The diode 222 outputs a current to charge the parasitic capacitors 206 and 208. The voltage level of the control terminal 218 is slowly raised to a pre-determined voltage level $V_{pre}$. The pre-determined voltage level $V_{pre}$ is dependent on the threshold voltage $V_{th}$ of the diode 222, for example, the pre-determined voltage level $V_{pre}$ may be the difference between the enable level of the bit line select signal 116 and the threshold voltage $V_{th}$. When the memory cell enters the write period, the first voltage source 102 may provide voltage pumping $\Delta V_1$ at the terminal 214 to generate a write current I to flow from the first voltage source 108 to the second voltage source 110. As for the voltage pumping period $T_3$, because of the parasitic capacitor 206, the control terminal 218 responds to the voltage pumping $\Delta V_1$ at the terminal 214. The voltage level $V_{218}$ is raised by a voltage variation $\Delta V_1$. The voltage pumping $\Delta V_1$ of the control terminal 218 results in an improved write current because a MOSFET provides greater current while being forced by a greater gate voltage.

Figure 3A:
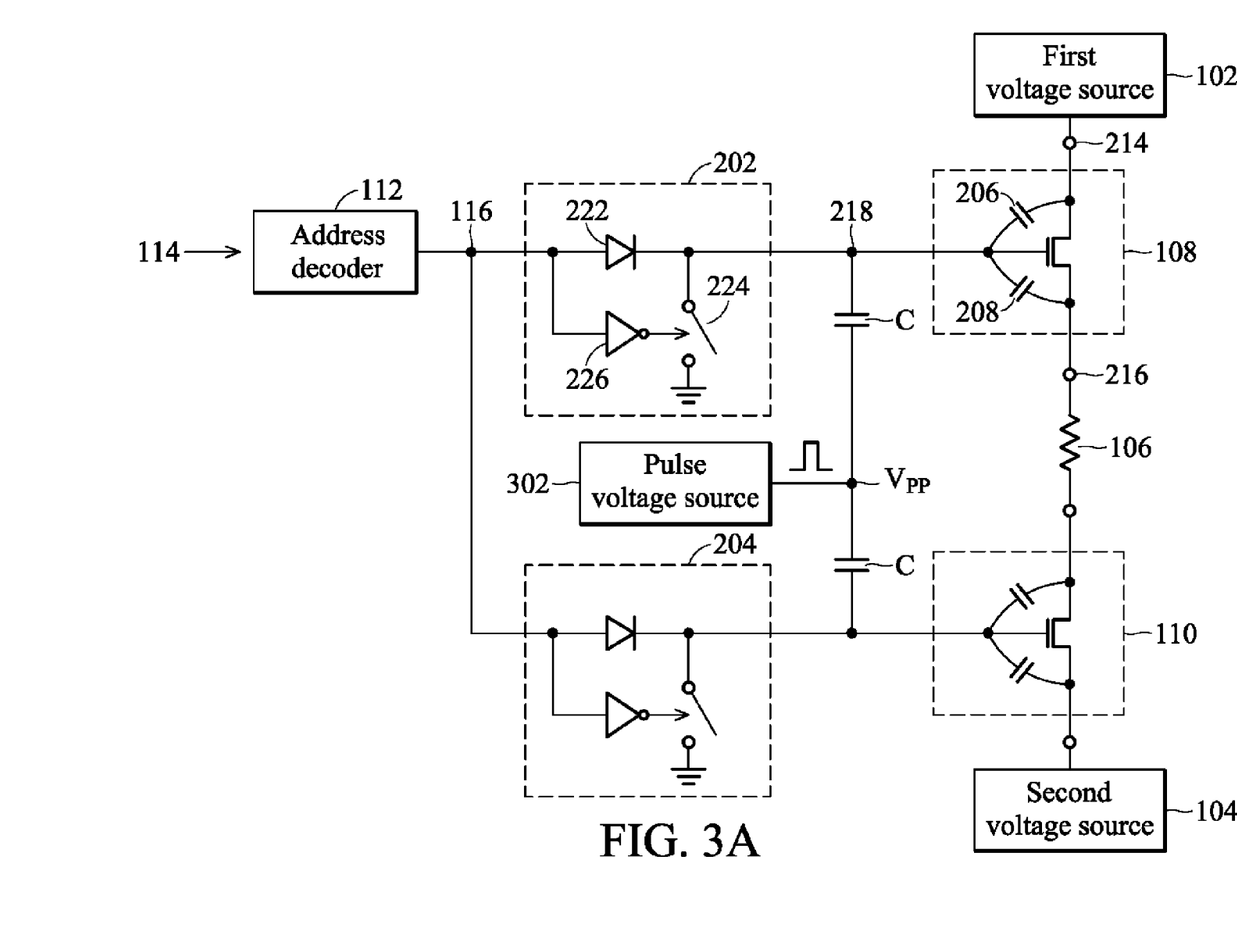
FIG. 3A depicts another embodiment of the memory cells of the invention.

FIG. 3A depicts another embodiment of the memory cells of the invention. Compared with FIG. 2A, FIG. 3A further comprises capacitors C and a pulse voltage source 302. The capacitors C are coupled between the pulse voltage source 302 and the control terminals of the write switches 108 and 110, respectively. The pulse voltage source 302 outputs a pulse voltage to the capacitors C after the control terminals of the write switches 108 and 110 reach the pre-determined voltage level. Because of the capacitors C, the voltage levels of the control terminals of the write switches 108 and 110 respond to the voltage pumping from the pulse voltage source 302 and are pumped to a voltage level greater than the pre-determined voltage level.

Figure 3B:
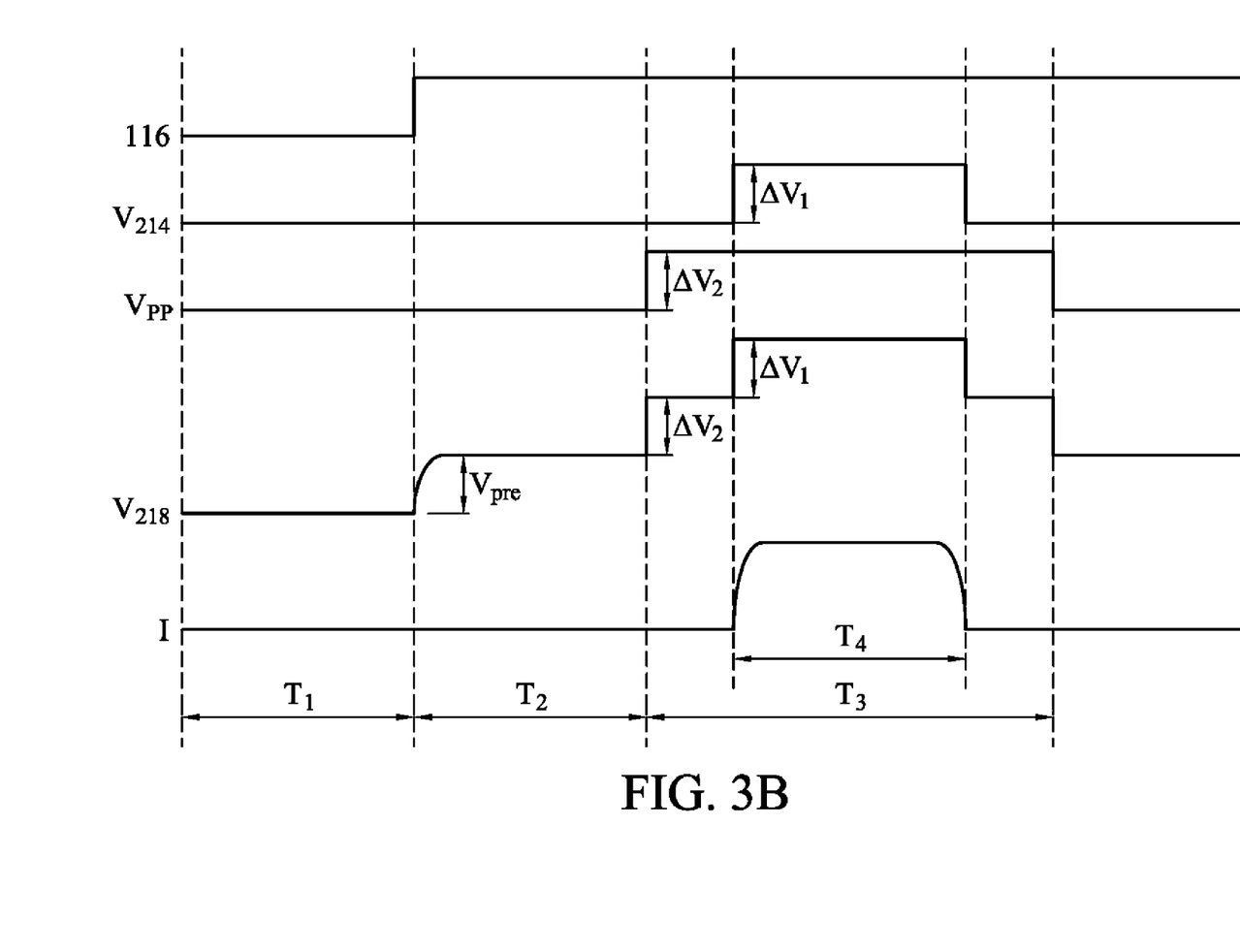
FIG. 3B shows waveforms of signals of FIG. 3A.

FIG. 3B shows waveforms of signals of FIG. 3A. As shown, FIG. 3B includes the bit line select signal 116, voltage waveforms $V_{214}$ and $V_{218}$ of terminals 214 and 248 of FIG. 3A, the output signal $V_{pp}$ of the pulse voltage source 302, and a current waveform I of the write current. Before the bit line select signal 116 is enabled (during the discharging period $T_1$), the inverter 226 outputs a high voltage level to turn on the switching element 226. Thus, the control terminal 218 of the write switch 108 is coupled to the ground and the parasitic capacitors 206 and 208 and the capacitor C are discharged. When the bit line select signal 116 is enabled, the memory cell enters the charging period $T_2$, the diode 222 is turned on, and the inverter 226 outputs a low voltage level signal to turn off the switching element 224. The parasitic capacitors 206 and 208 and the capacitor C are charged via the current from the diode 222. The voltage level $V_{218}$ of the control terminal 218 is slowly raised to the pre-determined voltage level $V_{pre}$. The pre-determined voltage level $V_{pre}$ is dependent on the threshold voltage $V_{th}$ of the diode 222, for example, the pre-determined voltage level $V_{pre}$ may equal to the difference between the enable level of the bit line select signal 116 and the threshold voltage $V_{th}$. Then, the pulse voltage source 302 outputs a pulse voltage (a voltage variation $\Delta V_2$ shown in waveform $V_{pp}$), and the memory cell enters the voltage pumping period $T_3$. Because of the capacitor C, the voltage level $V_{218}$ of the control terminal 218 responds to the voltage pumping $\Delta V_2$ and is raised by the voltage pumping $\Delta V_2$. In this case, the voltage pumping period $T_3$ further includes a time period $T_4$, the write period of the memory cell. In the write period $T_4$, the first voltage source 102 outputs a high voltage level to direct the write current to flow from the first voltage source 102 to the second voltage source 104, Thus, the first terminal 214 of the write switch 108 is raised by a voltage variation $\Delta V_1$. Because of the parasitic capacitor 206, the terminal 218 responds to the voltage variation $\Delta V_1$ and voltage waveform $V_{218}$ is raised by the voltage pumping $\Delta V_1$. Comparing the waveforms of FIGS. 2B and 3B, the capacitor C and the pulse voltage source 302 of FIG. 3B successfully raises the voltage level $V_{218}$ of the control terminal 218 of the write switch 108 to a greater voltage level for a greater write current I.

Figure 4A:
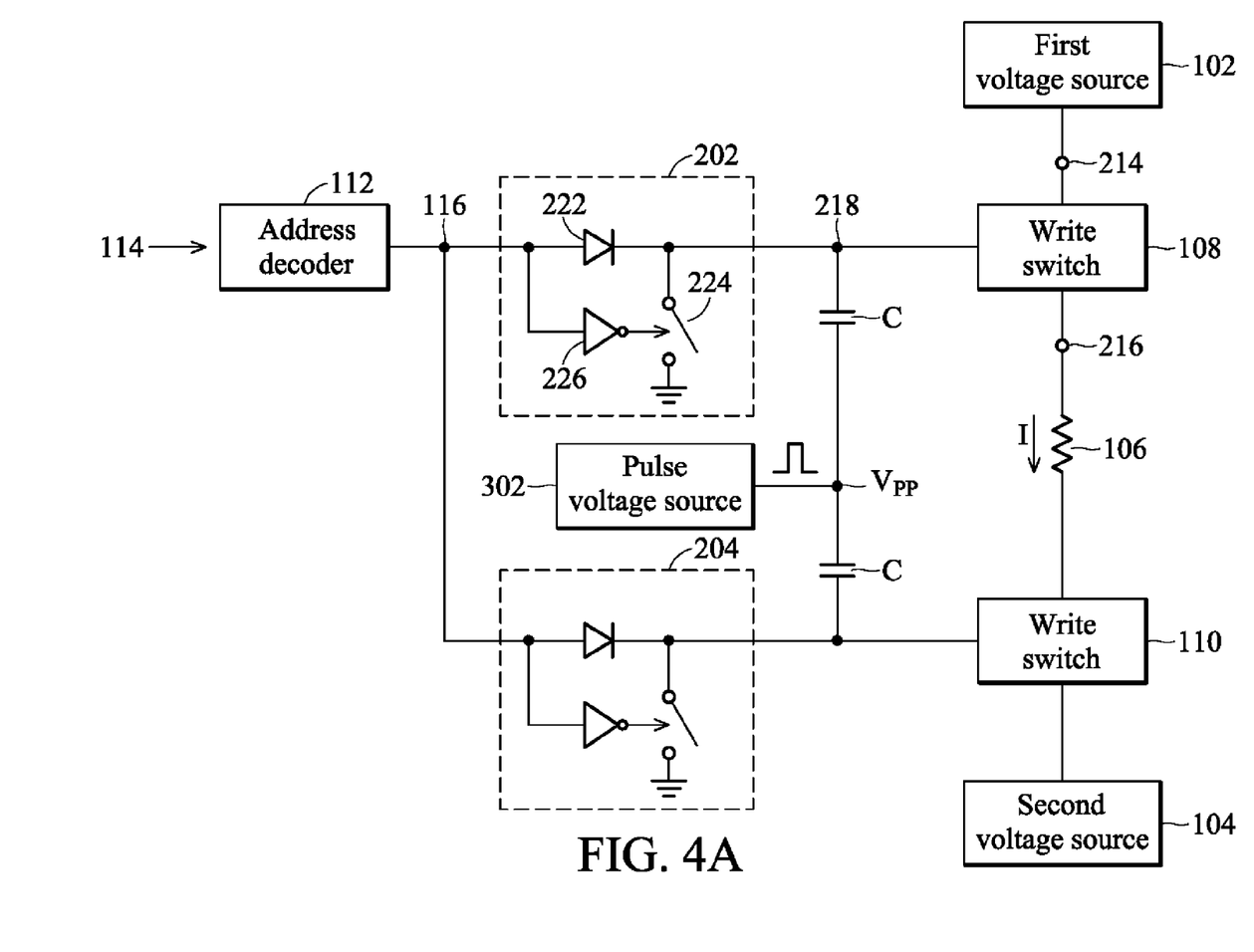
FIG. 4A depicts another embodiment of the memory cells of the invention.

FIG. 4A depicts another embodiment of the memory cells of the invention, wherein the write switches 108 and 110 are not limited to MOSFETs and may be replaced by any switching elements with a control terminal and controllable electric conduction. The electric conduction of the switching element is controlled by the control terminal, and the switching element may include no parasitic capacitors (like the parasitic capacitors 206-212). This embodiment uses capacitors C and a pulse voltage generator 302 to improve the voltage level of the control terminals of the write switches 108 and 110. Because of the capacitors C, the voltage levels of the control terminals of the write switches 108 and 110 respond to the voltage pumping from the pulse voltage source 302.

Figure 4B:
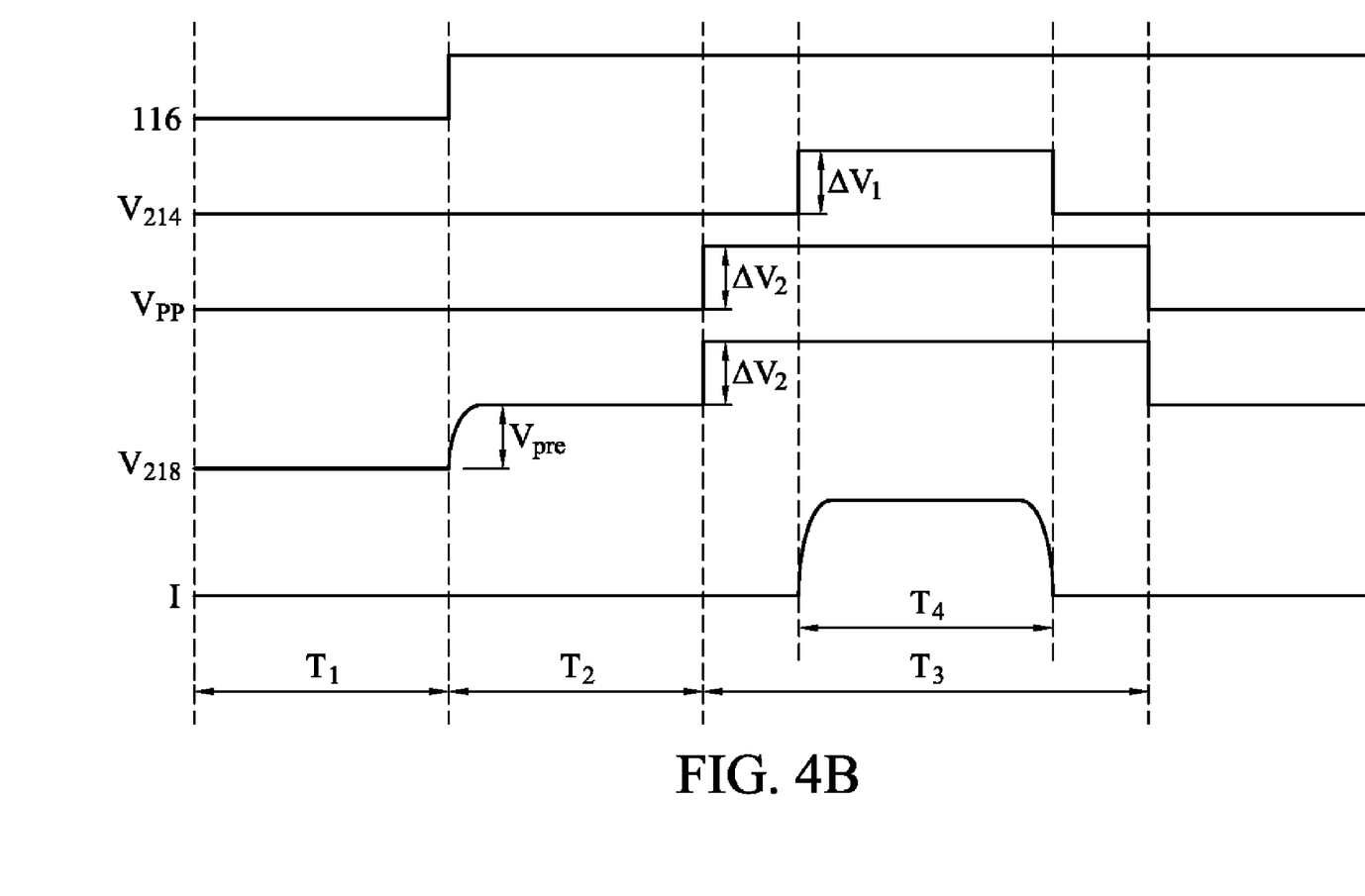
FIG. 4B shows waveforms of signals of FIG. 4A.

FIG. 4B shows waveforms of signals of FIG. 4A. As shown, FIG. 4B shows the bit line select signal 116, voltage waveforms $V_{214}$ and $V_{218}$ of terminals 214 and 218 of FIG. 4A, the output signal $V_{pp}$ of the pulse voltage source 302, and a current waveform I of the write current. Because of the capacitor C, the voltage level $V_{218}$ of the control terminals 218 of the write switch 108 is raised by a voltage variation $\Delta V_2$ to respond to the voltage variation $\Delta V_2$ at the voltage waveform $V_{pp}$. Because the write switch 108 of FIG. 4A does not include parasitic capacitors, the voltage pumping $\Delta V_1$ at the terminal 214 does not affect the terminal 218. Comparing FIGS. 3B and 4B, the write current improvement shown in FIG. 4B is not as good as that shown in FIG. 3B. However, the technique shown in FIGS. 4A and 4B is still better than the conventional techniques.

The control circuits of the invention are not limited to the structure shown in blocks 202 and 204. The control circuit can be replaced by any circuits capable of providing the discharging, charging and voltage pumping operation periods.

Furthermore, in addition to MRAMs, other current-controlled memories, such as PCMs, can use the techniques of the invention (voltage pumping at the control terminal of the write switch) to improve the write current thereof.

Figure 5:
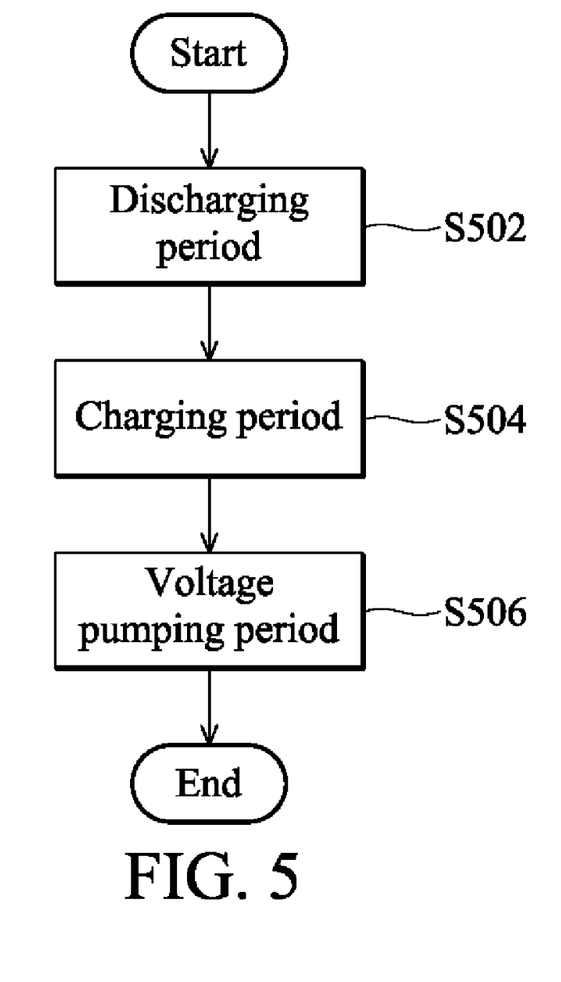
FIG. 5 depicts a flowchart controlling the memory cells of the invention.

FIG. 5 depicts a flowchart controlling the memory cells of the invention. In steps S502, S504 and S506, the control circuit forces the memory cell to a discharging period, charging period and a voltage pumping period, respectively. Referring to FIGS. 2B, 3B and 4B, the aforementioned time periods are represented by symbols $T_1$, $T_2$ and $T_3$, respectively.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory with improved write current, comprising:
   a bit line, having a first terminal and a second terminal;
   a first write switch, having a first terminal, a second terminal and a control terminal, wherein the first and second terminals of the first write switch are coupled to a first voltage source and the first terminal of the bit line, respectively, and there is a parasitic capacitor between the first terminal and the control terminal of the first write switch;
   a first control circuit, receiving a bit line select signal and coupled to the control terminal of the first write switch, wherein the first control circuit discharges the first parasitic capacitor when the bit line select signal is disabled,
   the first control circuit charges the first parasitic capacitor and turns on the first write switch when the bit line select signal is enabled, and
   the first voltage source is actuated after the control terminal of the first write switch reaches a pre-determined voltage level.

2. The memory as claimed in claim 1, wherein the first control circuit comprises:
   a first diode, having an input terminal receiving the bit line select signal and an output terminal coupled to the control terminal of the first write switch;
   a first switching element, coupled between the control terminal of the first write switch and a ground, and having a control terminal; and
   a first inverter, having an input terminal receiving the bit line select signal and an output terminal coupled to the control terminal of the first switching element.

3. The memory as claimed in claim 2, further comprising a capacitor coupled between the control terminal of the first write switch and a pulse voltage source, wherein the pulse voltage source outputs a pulse voltage after the control terminal of the first write switch reaches the pre-determined voltage level.

4. The memory as claimed in claim 2, wherein a second parasitic capacitor is coupled between the second and control terminals of the first write switch.

5. The memory as claimed in claim 4, further comprising:
a second write switch, having a first terminal, a second terminal and a control terminal, wherein the first and second terminals of the second write switch are coupled to the second terminal of the bit line and a second voltage source, respectively, and there is a third parasitic capacitor between the first and control terminals of the second write switch and a forth parasitic capacitor between the second and control terminals of the second write switch; and
a second control circuit, comprising:
   a second diode, having an input terminal receiving the bit line select signal and an output terminal coupled to the control terminal of the second write switch;
   a second switching element, coupled between the control terminal of the second write switch and the ground, and having a control terminal; and
   a second inverter, having an input terminal receiving the bit line select signal and an output terminal coupled to the control terminal of the second switching element.

6. The memory as claimed in claim 5, wherein the second voltage source is actuated after the control terminal of the second write switch reaches the pre-determined voltage level.

7. The memory as claimed in claim 6, further comprising a first capacitor coupled between the control terminal of the first write switch and a pulse voltage source, wherein the pulse voltage source outputs a pulse voltage after the control terminal of the first write switch reaches the pre-determined voltage level.

8. The memory as claimed in claim 7, further comprising a second capacitor coupled between the control terminal of the second write switch and the pulse voltage source.

9. The memory as claimed in claim 1, further comprising an address decoder decoding an address signal to generate the bit line select signal.

10. A memory with improved write current, comprising:
a bit line, having a first terminal and a second terminal;
a first write switch, having a first terminal, a second terminal and a control terminal, wherein the first and second terminals of the first write switch are coupled to a first voltage source and the first terminal of the bit line, respectively;
a first capacitor coupled between the control terminal of the first write switch and a pulse voltage source; and
a first control circuit, receiving a bit line select signal and coupled to the control terminal of the first write switch,
wherein the first control circuit discharges the first capacitor when the bit line select signal is disabled,
the first control circuit charges the first capacitor and turns on the first write switch when the bit line select signal is enabled, and
the pulse voltage source outputs a pulse voltage after the control terminal of the first write switch reaches a pre-determined voltage level.

11. The memory as claimed in claim 10, wherein the first control circuit comprises:
a first diode, having an input terminal receiving the bit line select signal and an output terminal coupled to the control terminal of the first write switch;
a first switching element, coupled between the control terminal of the first write switch and a ground, and having a control terminal; and
a first inverter, having an input terminal receiving the bit line select signal and an output terminal coupled to the control terminal of the first switching element.

12. The memory as claimed in claim 11, further comprising:
a second write switch, having a first terminal, a second terminal and a control terminal, wherein the first and second terminals of the second write switch are coupled to the second terminal of the bit line and a second voltage source, respectively;
a second capacitor coupled between the control terminal of the second write switch and the pulse voltage source; and
a second control circuit, comprising:
   a second diode, having an input terminal receiving the bit line select signal and an output terminal coupled to the control terminal of the second write switch;
   a second switching element, coupled between the control terminal of the second write switch and the ground, and having a control terminal; and
   a second inverter, having an input terminal receiving the bit line select signal and an output terminal coupled to the control terminal of the second switching element.

13. The memory as claimed in claim 10, further comprising an address decoder decoding an address signal to generate the bit line select signal.

* * * * *